(12) United States Patent
Watson et al.

(10) Patent No.: US 7,300,729 B2
(45) Date of Patent: Nov. 27, 2007

(54) METHOD FOR MONITORING A RETICLE

(75) Inventors: Sterling G. Watson, Palo Alto, CA (US); Ady Levy, Sunnyvale, CA (US); Chris A. Mack, Austin, TX (US); Stanley E. Stokowski, Danville, CA (US); Zain K. Saidin, San Mateo, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/394,145

(22) Filed: Mar. 29, 2006

(65) Prior Publication Data

US 2006/0234144 A1    Oct. 19, 2006

Related U.S. Application Data

(60) Provisional application No. 60/671,150, filed on Apr. 13, 2005.

(51) Int. Cl.
*G03F 9/00* (2006.01)
*G06K 9/00* (2006.01)

(52) U.S. Cl. ............................ 430/30; 430/5; 430/945; 382/144

(58) Field of Classification Search .................... 430/5, 430/30, 945; 382/144
See application file for complete search history.

(56) References Cited

U.S. PATENT DOCUMENTS

| | | | |
|---|---|---|---|
| 6,516,085 B1 | 2/2003 | Wiley et al. | |
| 6,654,489 B2 | 11/2003 | Wiley et al. | |
| 7,123,356 B1 | 10/2006 | Stokowski et al. | |
| 2004/0009416 A1 | 1/2004 | Peterson et al. | |
| 2004/0091142 A1 | 5/2004 | Peterson et al. | |
| 2005/0084767 A1* | 4/2005 | Zait et al. ...................... | 430/5 |
| 2006/0236294 A1 | 10/2006 | Saidin et al. | |

FOREIGN PATENT DOCUMENTS

WO  PCT/IL2004/000653    1/2005

* cited by examiner

*Primary Examiner*—Christopher G. Young
(74) *Attorney, Agent, or Firm*—Beyer Weaver LLP

(57) ABSTRACT

Reticles may comprise shading elements (SEs) for locally altering the reticle optical properties. However, such reticles may degrade over time as a result of repeated exposure to radiation in a lithography process, as the radiation may "heal" the SEs. Disclosed are techniques for monitoring a reticle in order to maintain confidence about the reticle's optical properties and the uniformity of patterns on wafers that are to be printed using the reticle. Reticles undergo periodic inspection comprising reticle transmission measurement and/or aerial imaging of the reticle. When such inspection indicates sufficient reticle degradation, the reticle is tagged for correction prior to its subsequent use in a lithography process.

14 Claims, 6 Drawing Sheets

METHOD FOR MONITORING A RETICLE

CROSS REFERENCE TO RELATED PATENT APPLICATION

This application claims priority of U.S. Provisional Patent Application Nos. U.S. Provisional Application No. 60/671,150 entitled "METHOD FOR MONITORING A RETICLE", filed 13 Apr. 2005 by Sterling G. Watson et al., which application is incorporated herein by reference in its entirety for all purposes.

FIELD OF INVENTION

The invention pertains in general to integrated circuit design and fabrication, and in particular to monitoring reticles.

BACKGROUND

Fabricating semiconductor devices such as logic and memory devices typically includes processing a substrate such as a semiconductor wafer using a number of semiconductor fabrication processes to form various features and multiple levels of the semiconductor devices. For example lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Lithography is typically one of the most important processes in integrated circuit manufacturing since this is the process in which features are patterned on the wafer. The pattern printed in a resist by lithography is then utilized as a masking layer to transfer the pattern to additional layers on the wafer in subsequent processing steps. Therefore, the pattern that is formed on the wafer during lithography directly affects the features of the integrated circuits that are formed on the wafer. Consequently, defects that are formed on the wafer during lithography may be particularly problematic for the integrated circuit manufacturing process. One of the many ways in which defects may be formed on the patterned wafer during lithography is by transfer of defects that are present on the reticle to the wafer. Therefore, detection and correction of defects on the reticle such as unwanted particulate or other matter are performed rather stringently to prevent as many defects on the reticle from being transferred to the wafer during lithography.

Accordingly, improved mechanisms for correcting problems or variations on the reticle are needed.

SUMMARY OF THE INVENTION

Disclosed are techniques for monitoring a reticle in order to maintain confidence about the reticle's optical properties and the uniformity of patterns on wafers that are to be printed using the reticle. Reticles undergo periodic inspection comprising reticle transmission measurement and/or aerial imaging of the reticle. When such inspection indicates sufficient reticle degradation, the reticle is tagged for correction prior to its subsequent use in a lithography process.

In one embodiment, a method for monitoring a reticle is disclosed. A reticle having embedded scatter elements (SE's) is provided. The SE's are one or more specific volumes of damage that were created with a laser at one or more positions embedded within the reticle to thereby alter the transmission levels through the reticle at particular regions of the reticle. It is determined whether a periodic inspection is due for the reticle or a wafer produced by such reticle. An inspection is performed on the reticle or the wafer when such periodic inspection is due. The reticle is used in a lithography process when the inspection indicates that the reticle or a wafer fabricated from such reticle has a predetermined level of uniformity of values of a particular parameter at a plurality of positions of the reticle or wafer.

In one implementation, the inspection includes measuring reticle transmission at a plurality of positions of the reticle and the reticle is used in a lithography process when the inspection indicates that the reticle has a predetermined level of uniformity of transmission measurements at a plurality of positions of the reticle. In another aspect, the inspection includes performing an aerial imaging of the reticle patterns and measuring a characteristic of the imaged reticle patterns. In this aspect, the reticle is used in a lithography process when the inspection indicates that the reticle has a predetermined level of uniformity of the measured characteristic at a plurality of positions of the imaged reticle patterns. In a further aspect, the measured characteristic is a critical dimension of an imaged reticle pattern. In another implementation, the inspection includes performing a critical dimension (CD) measurement at a plurality of positions on a wafer written using the reticle, and the reticle is used in a lithography process when the inspection indicates that the wafer has a predetermined level of uniformity of the CD measurement at a plurality of positions of the wafer.

In another aspect, the (SEs) were embedded within the reticle using a femto-second laser. In another implementation, the reticle is corrected when the inspection indicates that the reticle or a wafer fabricated from such reticle does not have a predetermined level of uniformity of values of a particular parameter at a plurality of positions of the reticle or wafer. The correcting operation is accomplished by embedding SE's within the reticle using a laser in order to substantially restore reticle uniformity. In a further aspect, the corrected reticle is used in a lithography process. In yet another aspect, the operations of performing the inspection and correcting are performed by a cluster tool that combines an inspection tool and a reticle modification tool.

In another embodiment, it is determined that a periodic inspection is due for the reticle after a predetermined number of exposures have been performed using the reticle. In another aspect, the predetermined number of exposures is adjusted based on a current confidence level in the uniformity persistence of the reticle. In another aspect, after a predetermined number of wafers have been fabricated using the reticle, it is determined that a periodic inspection is due for the wafer that was last fabricated by such reticle. In a further aspect, the predetermined number of wafers is adjusted based on a current confidence level in the uniformity persistence of the reticle.

In another implementation, performing the inspection indicates whether the reticle has been adversely affected by repeated exposure to radiation. In a further aspect, an indication that the reticle has been adversely affected by repeated exposure to radiation means that at least one of the SE's has undergone healing.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
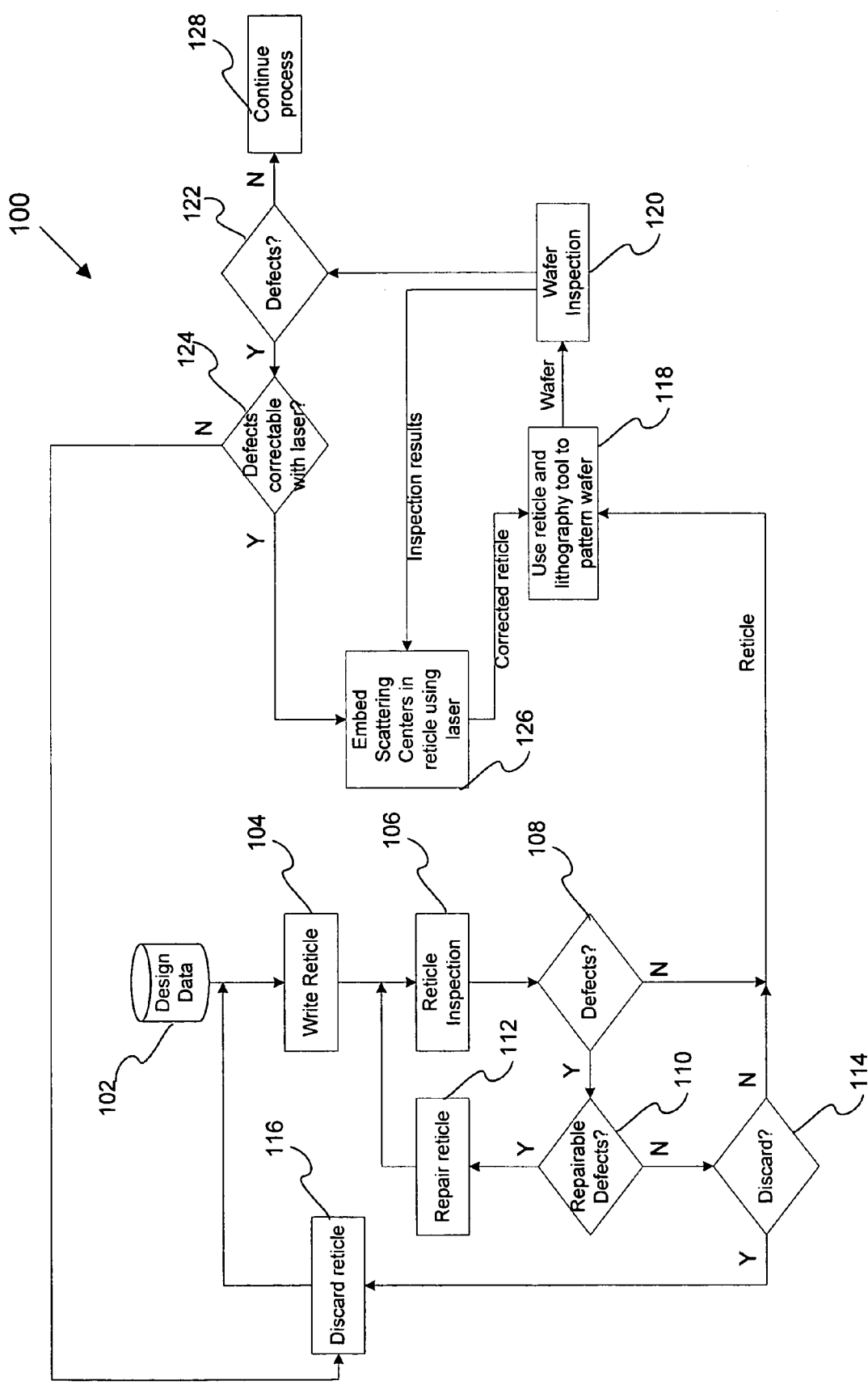
FIG. 1 is a flow diagram illustrating an integrated circuit (IC) device design process in which a laser may be utilized to change the optical properties of a reticle, in accordance with various embodiments of the present invention.

Reference will now be made in detail to a particular embodiment of the invention, examples of which are illustrated in the accompanying drawings. While the invention will be described in conjunction with the particular embodiments, it will be understood that it is not intended to limit the invention to the described embodiments. To the contrary, it is intended to cover alternatives, modifications, and equivalents as may be included within the spirit and scope of the invention as defined by the appended claims.

The terms "reticle" and "mask" are used interchangeably herein. A reticle generally includes a transparent substrate such as glass, borosilicate glass, and fused silica having a layer of opaque material formed thereon. A reticle may include additional materials formed under the opaque material such as an adhesion layer. In addition, a reticle may include additional materials formed on top of the opaque material such as a bottom anti-reflective coating, a resist (or "photoresist"), and a top anti-reflective layer. The opaque regions may be replaced by regions etched into the transparent substrate.

Patterned reticles are generated to be used as photomasks in the production of semiconductor and other devices. The patterns on a reticle are generally described in a "design database" and may comprise features for optical proximity correction (OPC). Once a reticle is written (i.e. manufactured) and comprises a set of patterns according to a design database, the written reticle patterns are compared to the design database to ensure that the written reticle patterns have been reproduced with sufficient fidelity, wherein the fidelity can be expressed using a set of parameters such as critical dimension and critical shapes. The present invention describes systems and methods for determining and correcting variations of reticle parameters.

Introduction

The present invention generally includes techniques for using a laser to correct or change one or more optical properties, such as a transmission level, at one or more specific regions in a reticle. One such laser apparatus is further described in International Application having Application No. PCT/IL2004/000653, filed 18 Jul. 2004, entitled "METHOD FOR CORRECTING CRITICAL DIMENSION VARIATIONS IN PHOTOMASKS" by Eitan et al, and U.S. Provisional Application No. 60/488,717, filed 18 Jul. 2003. These applications are incorporated herein by reference in their entirety for all purposes. In one example, CD variation is corrected by using a laser to form "scattering elements" (SEs) that are embedded within the reticle to obtain varying amounts of light transmission or dose through the reticle. In one specific example, a femto-second laser available from UC-Laser Technologies of Karmiel Israel may be used. The SEs are specific volumes of damage that are created with the laser at various positions embedded within the reticle to thereby alter the transmission levels through the reticle at particular regions of the reticle. An increase in the number of SEs created in a given region results in a reduction in dose through such region in the reticle, as compared with another region with fewer SEs. Thus, one region of the reticle can have a different dose than another region on the reticle as a result of specific SE placement by the laser. In this application of the laser, the resulting dose variation of the reticle is selected to cause a more uniform distribution of CD across the resulting wafer.

FIG. 1 is a flow diagram illustrating an integrated circuit (IC) device design process 100 in which a laser may be utilized to change the optical properties (e.g., reduce CD variation) of a reticle in accordance with various embodiments of the present invention. To provide a simplified introduction to basic concepts of the present invention, the following process 100 will initially be described in the context of using a laser only to correct CD variation that is indicated by a wafer inspection. Later described embodiments include various alternative applications of such laser to correct or change numerous types of optical properties, including dose variation, at various stages of the design process. This initial introduction is merely illustrative and is not meant to limit the scope of the invention.

Initially, design data is received at step 102. Design data may include any portion of an IC design for implementation in the IC device. The IC design can be developed using any number of suitable design techniques. For example, a designer may create the IC design by using preexisting schematic library blocks from various electronic design automation (EDA) tools. In some cases, the designer may create the IC design or part of the IC design from scratch with the aid of any suitable design system, such as conventional computer aided design (CAD) tools. For example, the designer may use a schematic CAD tool to plan the logic diagrams for a particular IC design. Still further, the designer may write a description of the IC design or portions of the IC design with the aid of a hardware design language, such as VHDL.

The IC design is generally converted into design data that is in a suitable format that allows a pattern corresponding to the IC design to be produced onto a reticle. For instance, design data may be in a GDSII format. Design data may also be in a format of a database, such as a circuit layout pattern database that is generated from the IC design using any suitable tool, for example, by using EDA or CAD tools. The circuit layout pattern database is composed of a plurality of electronic representations of layout patterns for IC layers that are converted into a plurality of reticles that are used to fabricate a plurality of physical layers of an IC device. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes, which together define the reticle pattern.

After the design data is received, the design data is used to write a reticle at step 104. The reticle may be written using any suitable pattern generator or reticle writer equipment, such as a vector scan E-beam tool model EBM-4500, which is commercially available from Nuflare Technology Inc., Japan. The reticle corresponds to one or more electronic representation(s) from the design data. The reticle is then inspected at step 106, and it is determined whether the reticle has any defects at step 108. Defects are defined herein as any discrepancy on the reticle, including missing material, extraneous material, variations in critical dimension (CD) across the reticle, etc. That is, a defect is generally any characteristic of the reticle that fails to meet an expected or ideal requirement.

If the reticle has no defects, the reticle is used along with one or more lithography tools (e.g., scanner, stepper, etc.) to pattern the wafer (e.g., the reticle is used to fabricate a physical layer of the IC device by transferring the reticle pattern onto a photoresist covering the wafer and then etch such pattern onto an underlying device layer of the wafer) at step 118. However, if the reticle has a defect, a determination is made as to whether the defect is repairable at step 110. A repairable defect may be defined according to any suitable guideline or specification. For instance, localized defects (e.g., extra pattern material on the reticle; missing pattern material on the reticle) in the reticle pattern can be deemed repairable. In some embodiments, the repairable defects are confined to a substantially limited area of the reticle pattern.

If the defect is repairable, the repairs are made at step 112 and the repaired reticle is then inspected again at step 106. If the defect is not repairable, it is then determined whether the reticle should be discarded at step 114. In certain cases, even when the reticle defects are not eliminated (or repaired) in the reticle pattern itself, the reticle may still be usable as further described below. If the reticle is not usable, then the reticle is discarded at step 116 and another reticle is written in operation 104. For instance, changes may be made to the design data, or the reticle writing process may be adjusted, in order to produce a non-defective reticle. If the determination in operation 114 is negative, then the inspected reticle can be used along with any suitable type of lithography tool to pattern the wafer at step 118.

After the wafer has been patterned with a lithography tool at step 118, the wafer can be inspected at step 120. Any conventionally available wafer inspection technique or mechanism can be used for inspecting the wafer. Next, a determination as to whether the wafer includes any defects is performed at step 122. If it is determined that no defects are present in the wafer, then the wafer is allowed to continue along the design process to fabricate the IC device (s) at step 128. However, if it is determined that a defect is present in the wafer, it is subsequently determined at step 124 whether the defect is correctable with a laser. For instance, a defect is correctable with a laser when it is determined that the wafer defect can be mitigated by a change to the effective light transmission through one or more regions of the reticle. Also, if it is determined that a defect is present, the wafer may be discarded.

If the defect is not correctable by use of a laser, step 116 is repeated and the reticle is discarded. However, if the defect is correctable, then the laser may be used to embed "shading elements" or SEs within the reticle in order to change the light transmission properties of the reticle at specific regions of the reticle. The properties of the SEs (such as density, size, and type) can be based on the inspection results (e.g., CD variation information) received from the wafer inspection 120. After embedding SEs within the reticle, the corrected reticle can be used along with various lithography tools to pattern another wafer at step 118.

It should be noted that the present invention can employ any suitable number and type of reticle and/or wafer inspection or defect review tools. For example, KLA 301, 351, or 353UV Reticle Inspection Tools, AIT-XP, eS20XP, TeraStar, and SL3UV inspection tools, or eV300 and CRS3100 review tools, commercially available from KLA-Tencor of San Jose, Calif., may be employed. Each inspection tool may take the form of an optical system, such as a bright field or dark field optical system. The station may also utilize both bright field and dark field modes. Examples of bright field systems include the 2350, 2351, 2360, and 2370 from KLA-Tencor, Corp. of San Jose, Calif. Examples of dark field system include the AIT II, AIT XP, Fusion, Fusion UV, and SP1 PatternPro available from KLA-Tencor, Corp. of San Jose, Calif. Each tool may also take the form of an electron beam (ebeam) system, such as a scanning, snapshot, or step-and-repeat type ebeam system. A station may be designed to detect special types of defects, such as macro defects across a large area of the sample, defects on a bare substrate, or defects within solder bumps (e.g., ball grid array bumps). Each inspection tool may be a stand alone device or integrated within a processing or lithography tool. Additionally, the laser correction tool (e.g., used to embed SEs in the reticle at step 126) may be a separate device or integrated within any inspection, processing, or lithography tool.

Widening the Process Window

In one application, the laser correction tool may be used to embed scattering centers in a reticle so as to widen the process window of such reticle. A lithography process comprises a set of parameters, such as illumination level (or dose), lens focus, etc. Each parameter has an associated range, such that if the parameters are within their associated ranges, the resulting printed wafer will be within specification tolerances. The collection of lithography parameter values that are within their respective ranges is herein referred to as a "process window."

Considering each parameter as a dimension in the multi-dimensional space given by the lithography parameters, a process window can be visualized as a volume in the multi-dimensional parameter space. It is desirable to make a given process window as wide as possible, since this translates into an increase in the tolerance of the lithography process with respect to parameter variations while still printing a wafer that is within specification tolerances. However, the process window is generally a function of the regions on the lithography mask, and in some mask regions the process window is tighter than in other mask regions. In general, mask regions with tighter mask patterns have tighter tolerance windows.

In general, the overall process window for any particular mask is given by the intersection of the individual process windows of the various regions on the mask, with the mask generally divided into a finite number of regions which collectively make up the entire mask. Therefore, it is desirable to maximize the intersection (i.e. overlap) of the individual process windows. While this requirement is slightly relaxed in lithography settings where some process parameters such as illumination intensity and focus can be varied as a function of mask region, the available degree of such variation is generally limited, and therefore maximizing the intersection of process windows is desirable even in such lithography settings having the benefit of region-dependent parameter variation.

Figure 2B:
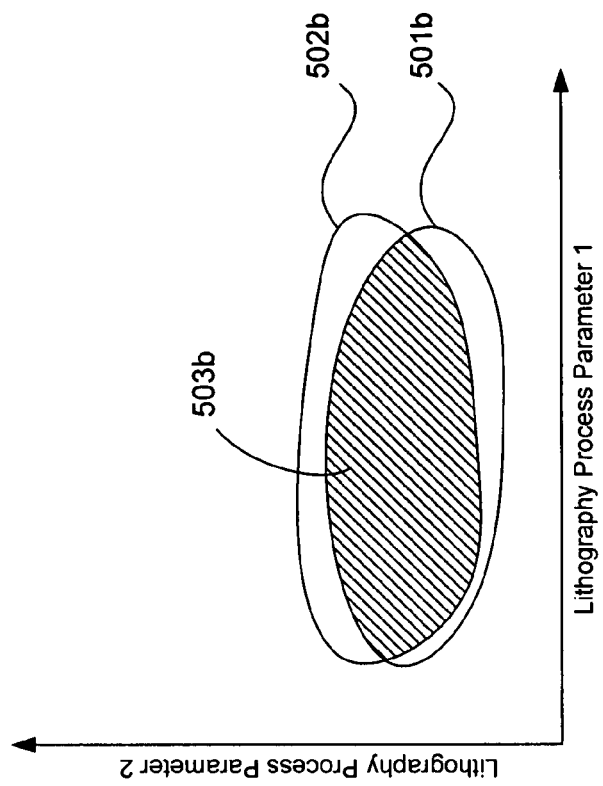
FIG. 2b illustrates the two regions on the reticle of FIG. 2a after the reticle has been modified.
Figure 2A:
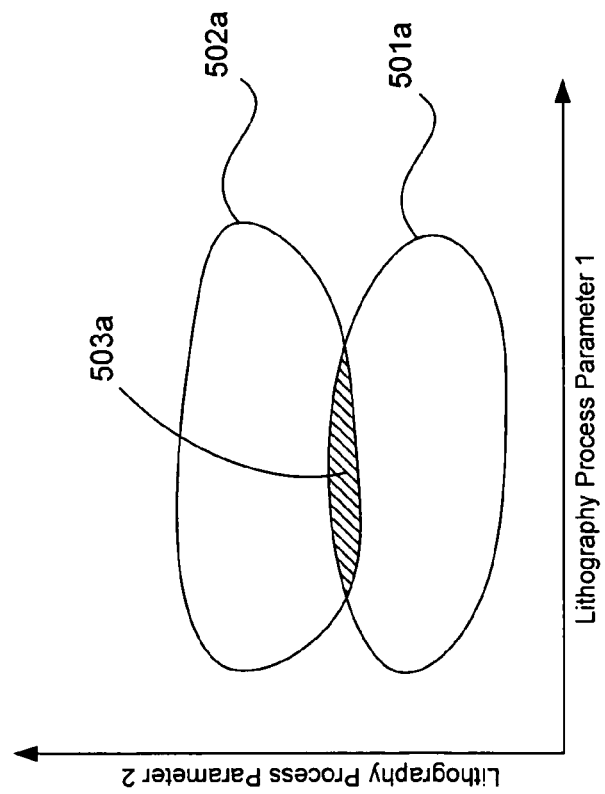
FIG. 2a illustrates two regions on a reticle having two associated process windows.

As an example, consider two particular regions on a lithography mask (for example two rectangular regions on the mask), with the two regions having two associated process windows 501a and 502a, as shown in the diagram of FIG. 2a. As described above, it is generally desirable to modify the mask and move one or more of the process windows 501a and 502a in a way that results in an increase in the overlap the two process windows. The result of one such example mask modification is illustrated in the diagram of FIG. 2b, showing an increase in the overlap 503b between the process window 501b (which has not moved as a result of the mask modification) and the process window 502b (which has moved as a result of the mask modification).

Figure 3B:
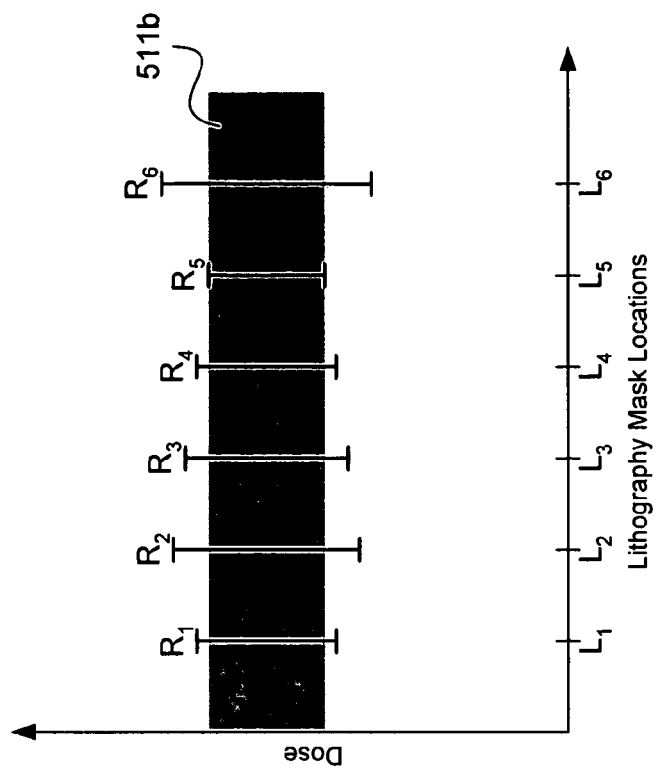
FIG. 3b illustrates example regions on a reticle having different associated dose ranges after adding scattering centers to selected regions in accordance with one embodiment of the present invention.
Figure 3A:
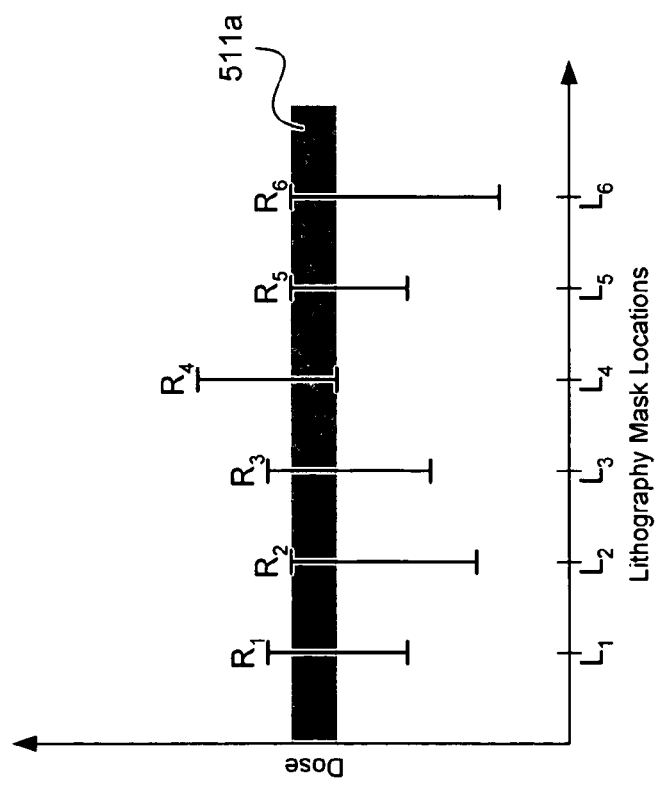
FIG. 3a illustrates example regions on a reticle having different associated dose ranges in accordance with one embodiment of the present invention.

One particular way to achieve this type of mask modification is to use a short-burst laser to embed scattering centers within the mask glass. One particular implementation of this technique is described in above-referenced International Application having Application No. PCT/IL2004/000653 and U.S. Provisional Application No. 60/488,717. Embedding scattering centers in particular region within the mask glass decreases the amount of illumination that is transmitted through the particular mask region onto the wafer. As a result, the range of acceptable illumination intensity through the particular region adjusts upward (i.e. towards higher intensities), since the scattering centers decrease the effective illumination intensity seen at the wafer. The range of acceptable illumination intensity for a particular mask region is referred to as the "dose" associated with that region, and the scattering centers in effect allow an upward adjustment in dose. As an illustrative example, consider a series of example regions $L_1, \ldots, L_6$ on a particular example lithography mask, with each region having an associated dose expressed as ranges $R_1, \ldots, R_6$ and producing an overall process window 511a, as shown in FIG. 3a. Embedding appropriate scattering centers into mask regions $L_1, L_2, L_3, L_5$ and $L_6$ raises their respective dose ranges $R_1, R_2, R_3, R_5$ and $R_6$ and aligns them, thereby increasing the intersection of the dose ranges $R_1, \ldots, R_6$ and widening the overall process window 511b as shown in FIG. 3b.

Detecting and Correcting Global Reticle Variations

As described above, once a reticle is produced according to a design, the reticle is generally inspected and compared to the design. Variations between the actual reticle patterns and the intended design patterns may be of a local or a global nature. While local nanometer level variations are generally addressed by modifying the design in the reticle design database, and micrometer level variations caused by the underlying reticle manufacturing process are generally repaired using reticle repair tools, there are global reticle variations which do not lend themselves to correction by re-design or by using micrometer level repair tools. For example, if a reticle inspection identifies a need for gradual dose reduction across a reticle, for example from the top-left to the bottom-right of the reticle, a global design revision of the reticle may not be an efficient or practical remedy as it may involve revising potentially billions of geometric features in the design database. A more efficient remedy may be provided by modifying the reticle such that it compensates for the global dose variation without the need to first revise the bulk of the reticle design and then manufacture a new reticle based on the revised design. However, in order to repair such global reticle variations, such variations will have to first be properly determined.

While some reticle inspection approaches generally identify and aggregate a set of localized reticle flaws, there are other reticle inspection approaches that identify global trending variations across the reticle, such as reticle variations caused by non-uniformity in the reticle manufacturing process. Some such inspection approaches are described in U.S. Pat. No. 6,516,085 filed May $3^{rd}$, 1999, entitled "APPARATUS AND METHOD FOR COLLECTING GLOBAL DATA DURING A RETICLE INSPECTION" by Wiley et al, and U.S. Pat. No. 6,654,489 filed Dec. $4^{th}$, 2004, entitled "APPARATUS AND METHOD FOR COLLECTING GLOBAL DATA DURING A RETICLE INSPECTION" by Wiley et al, which patents are incorporated herein by reference.

For instance, the CD map of a reticle may indicate that the feature lines on the reticle are too thin in one or more regions of the reticle, preventing the reticle from blocking an adequate amount of light through the identified reticle regions. When the identified reticle regions are large (for example on a millimeter scale), they may render revision to the design database or repairing the identified reticle flaws too numerous and therefore inefficient and impractical. In such a case, as disclosed by the present invention, instead of repairing a large number of individual reticle flaws, the reticle can be repaired by correcting the dose in such identified reticle regions, thereby allowing the regions to block an adequate amount of light and thereby remedy the identified global-scale reticle flaws. Conversely, the dose through a specific region of the reticle may be effectively increased by increasing the overall dose through the entire reticle as applied by the lithography tool and then decreasing the dose to other regions on the reticle by embedding scattering centers in such other regions. Such dose correction in effect reduces light wherever reticle lines are-too thick, which in turn reduces reticle variations and results in a more uniform reticle CD. Note that while in general the reticle is not the only contributor to variations on the wafer CD, it nevertheless is a contributor and accounting for this variable early in the lithography process ultimately contributes to increasing the final wafer fidelity.

One way of correcting the dose in reticle regions comprises embedding scattering centers within identified reticle regions using a laser (such as a femto-second laser), for example as described in the above-referenced International Application having Application No. PCT/IL2004/000653.

Figure 4:
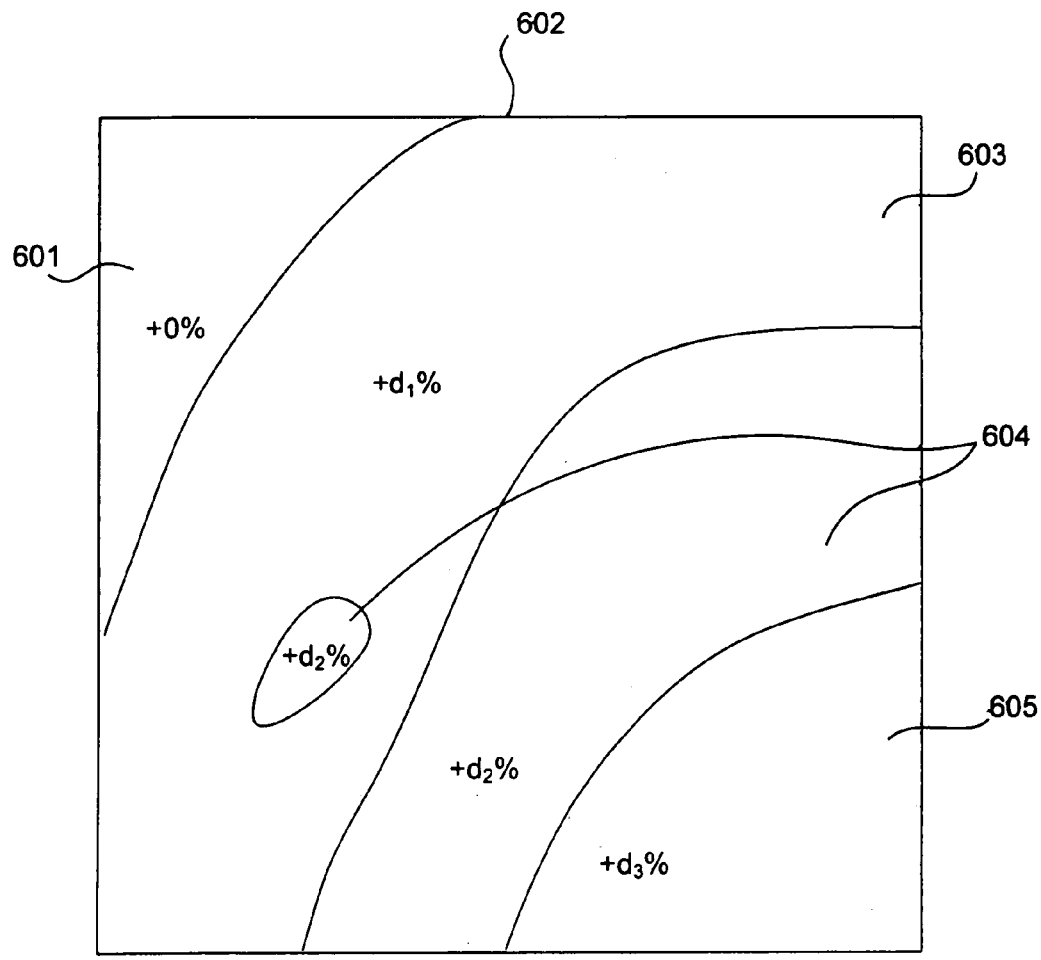
FIG. 4 is a diagrammatic depiction of a reticle exhibiting an exemplary global-scale variation in the thickness of the feature lines (the feature lines are not shown), in accordance with an embodiment of the present invention.

In order to illustrate the above discussion, FIG. 4 shows a diagrammatic depiction of a reticle 601 exhibiting an exemplary global-scale variation in the thickness of the feature lines (the feature lines are not shown). As shown, the general reticle regions 602-605 exhibit a global trend of increasing thickness of feature lines. Region 602 indicates proper dose and does not need dose correction; region 603 indicates a reticle dose level of $+d_1\%$ above desired dose level; the two regions 604 indicate a reticle dose level of $+d_2\%$ above desired dose level; and region 605 indicates a reticle dose level of $+d_3\%$ above desired dose level. Note that the desired dose level are as indicated by the amount of light that would pass through the respective reticle regions had the reticle been manufactured exactly as designed. For example, the particular manufacturing process used may produce a reticle with $d_1=5\%$, $d_2=15\%$ and $d_3=25\%$. Using a dose correction approach, region 603 can be embedded with an appropriate amount of scattering centers in order to reduce the dose by $d_1\%$, thereby adequately compensating for the dose level of this particular manufactured reticle. Similarly, regions 604 and 605 can be embedded with appropriate amounts of scattering centers in order to reduce their dose by $+d_2\%$ and $+d_3\%$, respectively. After a reticle undergoes a change in dose, the overall dose in the subsequent lithography process (in which the reticle is used as a photomask) is adjusted appropriately to compensate for the overall change in reticle dose.

Figure 5:
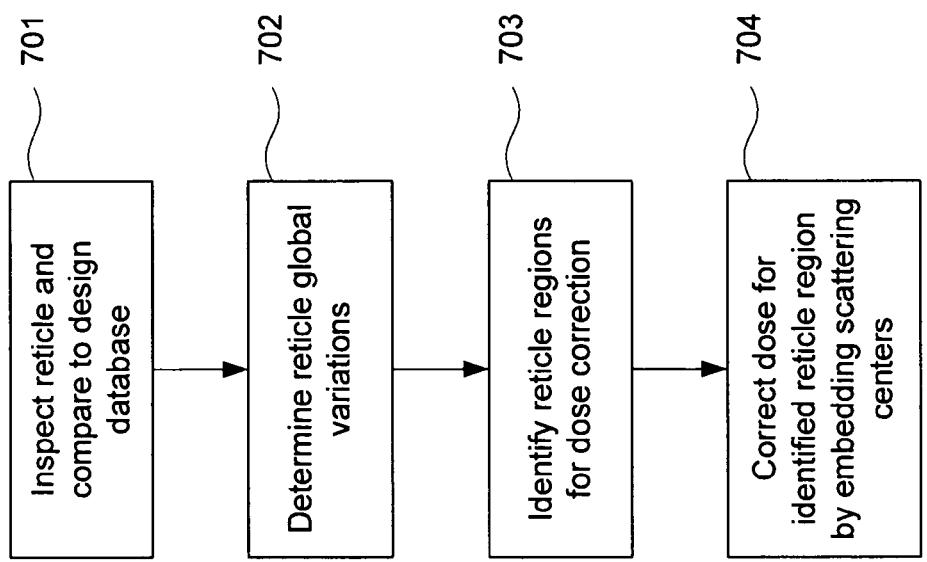
FIG. 5 is a flow diagram illustrating a method for determining and correcting reticle variations, in accordance with an embodiment of the present invention.

FIG. 5 is a flow diagram illustrating a method for determining and correcting reticle variations, in accordance with an embodiment of the present invention. At step 701, a manufactured reticle is inspected by comparing it to its corresponding design database (or any suitable reference). This inspection step may use one or more parameters, such as the amount of light passing through regions of the reticle, or the level of gain that was applied to get the database design (i.e. the geometric shapes in the database) match the actual die (reticle). Note that inspection step 701 in effect compares the actual reticle features (per manufacture) to the intended reticle feature (per design). In other words, the inspection step 701 does not evaluate the merits of the reticle design, but merely determines how well the design is realized in the manufactured reticle.

In general, any suitable inspection process may be utilized to obtain global variations of a particular parameter, such as CD. For example, a test image obtained from the reticle under test may be compared to a reference image obtained from the design database or another image portion of the same or another reticle. The test image may alternatively be in the form of an aerial image that is calculated from light patterns through the reticle under operating conditions set up to emulate the performance of a physical lithography system, instead of being obtained by an inspection imager. Several embodiments of aerial image inspection techniques are described further in U.S. patent application Ser. No. 09/679,617, entitled "METHODS AND SYSTEMS FOR INSPECTING RETICLES USING AERIAL IMAGING AND DIE-TO-DATABASE DETECTION", filed 6 Oct. 2003 by Stokowski et al., which application is incorporated herein by reference in its entirety.

Based on the inspection results of step 701, step 702 determines global variations of the reticle. One exemplary set of global variations was described above in FIG. 2. Based on the determined global variations, step 703 identifies regions of the reticle that will benefit from dose correction. For an identified reticle region, the level of dose correction is set to compensate for the level of variation exhibited by the reticle region, resulting in a "dose map" which identifies reticle regions and their associated levels of dose correction. In general, reticle regions with higher deviation levels benefit from higher levels of dose correction.

The dose map is then used to correct detected variations in order to improve global parameter uniformity across the reticle. In one embodiment, the dose map is communicated to a system which modifies the reticle in order to improve the variations. This is shown at step 704, which comprises modifying the reticle by embedding scattering centers into the identified reticle regions according to their respective levels of dose correction. As described in the above-referenced International Application having Application No. PCT/IL2004/000653, the scattering centers are embedded within the reticle using a laser (such as a femto-second laser). In one specific example, a femto-second laser available from UC-Laser Technologies of Karmiel Israel may be used.

In another embodiment, the dose map (or in general a global variation map identifying reticle regions in need of compensation) is transferred to a system, such as a wafer stepper or scanner, which modifies the conditions under which the reticle is used to manufacture wafers, thereby compensating for the variations and producing wafers that are according to design. One such example comprises modifying the dose in a scanner in the scan direction and along the scanner slit, based on the variation data obtained via reticle inspection.

Monitoring a Modified Reticle

As described above, reticles may comprise scattering elements (SEs) for locally altering reticle optical properties. Such SEs are embedded into the reticle using a laser, and may be regarded as very small "damages" within the reticle glass (or other transparent substance in the reticle). However, such reticles may degrade over time as a result of repeated exposure to radiation in a lithography process, as the radiation may alter or "heal" the SEs. Therefore, it is desirable to monitor such reticles during their use in a lithography process in order to take corrective measures once the reticle is too degraded to produce wafers with proper critical dimension (CD) uniformity.

A reticle which is modified as described above, such as by using a laser to embed SEs within the reticle, eventually may be used in a lithography process to produce one or more wafers. In such a lithography process, the reticle is placed in the path of exposure radiation so that the radatiation is masked according to the reticle patterns before interacting with the wafer photoresist.

A side effect of using the reticle in lithography process is that the reticle may degrade over time as a result of repeated exposure to radiation. The longer the reticle is exposed to radiation, e.g. the more wafers are produced using the reticle, the larger the cumulative effect of the exposure radiation will be on the reticle. While in general this effect may not be significant, in the particular case of a modified reticle comprising embedded SEs the repeated exposure to the radiation may affect the embedded SEs and alter the properties of the reticle, thereby disturbing the uniformity of pattern on wafers that are printed using the reticle.

Note that the SEs are in fact very small "damages" embedded within the glass (or in general, the transparent material) of the reticle in order to locally alter the optical and refractive properties of the reticle. Hence, repeated exposure of the reticle to radiation during lithography may have a "healing" effect on these "damages" and thereby alter the embedded SEs. Since the SEs were embedded within the reticle in order to locally modify and improve the reticle's optical characteristics, it follows that such a modified reticle may degrade as a result of exposure to radiation.

Unfortunately, it may not be clear how the reticle may degrade with repeated exposure, and how to express the degradation as a function of time and exposure. In order words, the continuing stability of the reticle is of concern, and it is desirable to monitor the reticle to remain confident about the uniformity of patterns on wafers that are to be written using the reticle.

One approach comprises periodic inspection of the reticle, and/or one or more wafers produced using the reticle, as the reticle is repeatedly used in the lithography process. For example, every n exposures, (a) the reticle is inspected for degradation or other types of newly generated defects, and/or (b) the n-th produced wafer is inspected for non-uniformity possibly resulting from a degradation of the reticle. By way of example, n can be set to 500. Note that lower or higher numbers can be used, and in general the number can be tuned and stabilized as confidence in the periodic inspection increases.

A periodic reticle inspection may comprise measuring light transmission through regions of the reticle, as mentioned above as well as described in above-referenced U.S. Pat. Nos. 6,516,085 and 6,654,489. Separately, or in combination with measuring reticle light transmission, the inspection may also comprise aerial imaging of the reticle patterns, for example as described in above-referenced U.S. patent application Ser. No. 09/679,617. Note that while transmission inspection measures the amount of exposure radiation passing through reticle regions, aerial imaging attempts to imitate the way exposure would take place in a stepper as the exposure radiation is transmitted through the reticle and collected by optics onto a wafer, thereby inferring an optical image which would be projected onto the wafer photoresist.

Note that while printed wafer CD measurements can be used to inspect for uniformity, the absolute CD of the actual printed wafers are not necessarily needed, since the aerial image may be adequate for gaining sufficient confidence on such uniformity in order to decide whether or not to use the reticle to print wafers. Hence, knowledge of the wafer photoresist parameters may not be necessary in order to check for pattern uniformity, and aerial imaging may thereby grant a shortcut for reticle inspection by bypassing actual printing of test wafers in some cases. In general, an aerial image is examined to ensure that the CD would be uniform across the wafer. If uniformity is sufficiently likely, the reticle may be used to print wafers. Otherwise, the reticle is preferably repaired, corrected or otherwise modified in order to achieve higher CD uniformity prior to using the reticle to print wafers.

Figure 6:
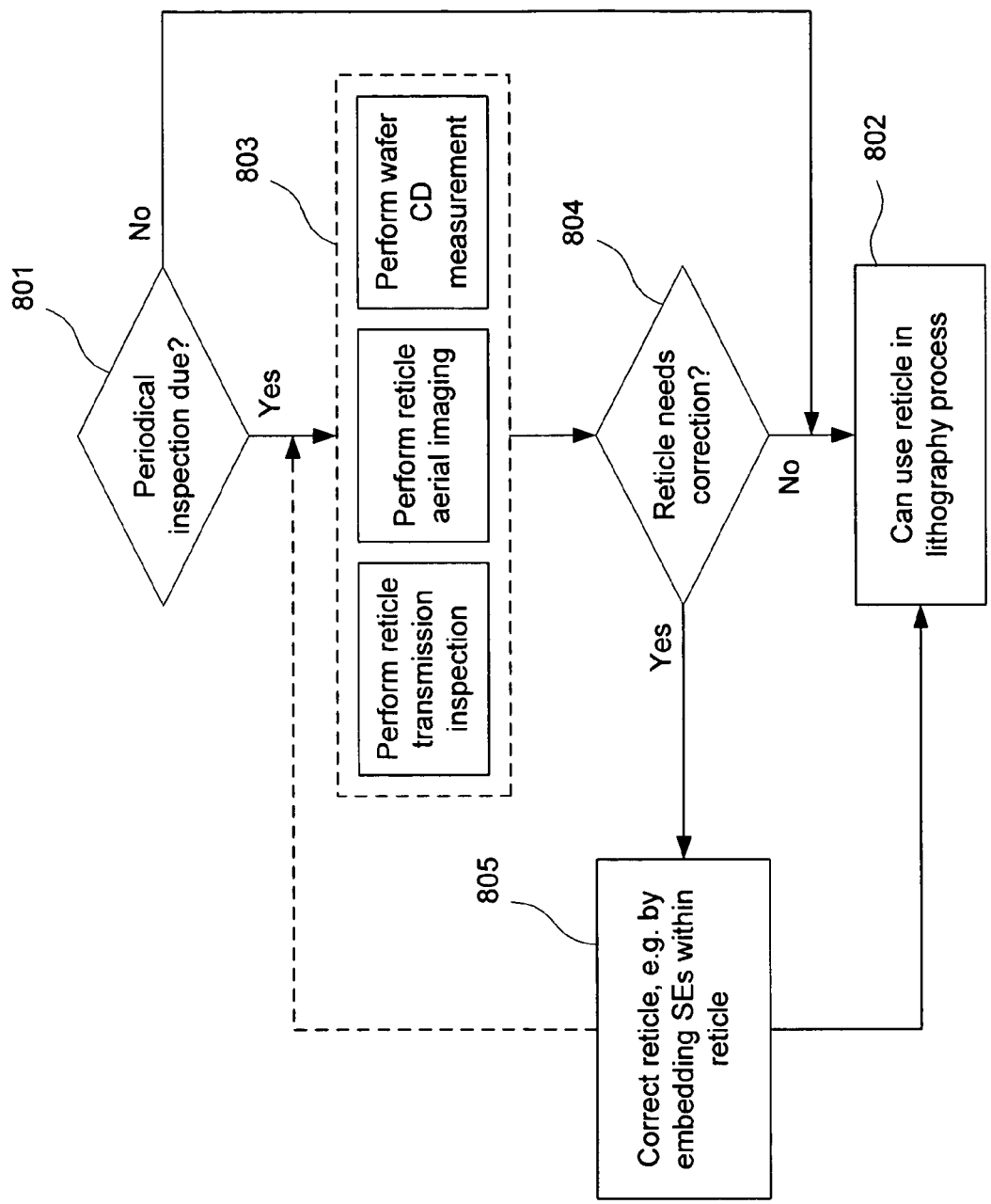
FIG. 6 is a flow diagram illustrating a method for monitoring a reticle, in accordance with an embodiment of the present invention.

FIG. 6 is a flow diagram illustrating a method for monitoring a reticle, in accordance with an embodiment of the present invention. Given a reticle, step 801 determines whether a periodical inspection is due. As described above, this can mean that the reticle has been used in n=500 (or any other specified number) exposures, and hence an inspection is due. If such an inspection is not due, the reticle may simply be used in step 802 in a lithography process. However, if such an inspection is due, the reticle, and/or the n-th wafer, are inspected in step 803. As described above, such an inspection may involve a reticle transmission measurement, an aerial imaging procedure and/or a wafer CD measurement. Based on results obtained by such inspections, step 804 determines whether the reticle needs to be corrected for the effects of repeated exposure to radiation (such as "healing" of SEs). If no such correction is needed, once again the reticle may simply be used in step 802 in a lithography process. However, if the reticle is to be corrected, at step 805 such corrections are performed on the reticle, for example by embedding further SEs within identified regions of the reticle in order to restore the desired optical properties of those reticle regions and restore suitability of the reticle for use in a lithography process. Once such corrections are made, the reticle may be used in step 802 in a lithography process, or may optionally undergo another inspection at step 803 in order to verify that the corrections have their desirable effect.

While in general reticle modification (e.g. reticle correction via laser-induced SEs) and reticle monitoring can be performed by separate tools, an optional embodiment of the present invention combines a reticle inspection tool and a reticle modification tool, resulting in a "cluster tool" which can both inspect the reticle and, among other things, identify reticle regions that would benefit from modification as well as perform such modifications on the reticle. Optionally, such a tool may also have the capability, as described above, to monitor the reticle overtime for developing damages or "healing" of reticle modifications as a result of exposure radiation.

Foregoing described embodiments of the invention are provided as illustrations and descriptions. They are not intended to limit the invention to precise form described. Other variations and embodiments are possible in light of above teachings, and it is thus intended that the scope of invention not be limited by this Detailed Description, but rather by Claims following.

We claim:

1. A method for monitoring a reticle, comprising:
providing a reticle having embedded scatter elements (SE's), wherein the SE's are one or more specific volumes of damage that were created with a laser at one or more positions embedded within the reticle to thereby alter the transmission levels through the reticle at particular regions of the reticle;
determining whether a periodic inspection is due for the reticle or a wafer produced by such reticle;
performing an inspection on the reticle or the wafer when such periodic inspection is due;
using the reticle in a lithography process when the inspection indicates that the reticle or a wafer fabricated from such reticle has a predetermined level of uniformity of values of a particular parameter at a plurality of positions of the reticle or wafer; and
correcting the reticle when the inspection indicates that the reticle or a wafer fabricated from such reticle does not have a predetermined level of uniformity of values of a particular parameter at a plurality of positions of the reticle or wafer, wherein the correcting operation is accomplished by embedding SE's within the reticle using a laser in order to substantially restore reticle uniformity.

2. The method of claim 1, wherein the inspection comprises measuring reticle transmission at a plurality of positions of the reticle and wherein the reticle is used in a lithography process when the inspection indicates that the reticle has a predetermined level of uniformity of transmission measurements at a plurality of positions of the reticle.

3. The method of claim 1, wherein the inspection comprises performing an aerial imaging of the reticle patterns and measuring a characteristic of the imaged reticle patterns, and wherein the reticle is used in a lithography process when the inspection indicates that the reticle has a predetermined level of uniformity of the measured characteristic at a plurality of positions of the imaged reticle patterns.

4. The method of claim 3, wherein the measured characteristic is a critical dimension of an imaged reticle pattern.

5. The method of claim 1, wherein the inspection comprises performing a critical dimension (CD) measurement at a plurality of positions on a wafer written using the reticle, and wherein the reticle is used in a lithography process when the inspection indicates that the wafer has a predetermined level of uniformity of the CD measurement at a plurality of positions of the wafer.

6. The method of claim 1, wherein the (SEs) were embedded within the reticle using a femto-second laser.

7. The method of claim 1, further comprising using the corrected reticle in a lithography process.

8. The method of claim 1, wherein the operations of performing the inspection and correcting are performed by a cluster tool that combines an inspection tool and a reticle modification tool.

9. The method of claim 1, wherein it is determined that a periodic inspection is due for the reticle after a predetermined number of exposures have been performed using the reticle.

10. The method of claim 9, further comprising adjusting the predetermined number based on a current confidence level in the uniformity persistence of the reticle.

11. The method of claim 1, wherein after a predetermined number of wafers have been fabricated using the reticle, it is determined that a periodic inspection is due for the wafer that was last fabricated by such reticle.

12. The method of claim 11, further comprising adjusting the predetermined number based on a current confidence level in the uniformity persistence of the reticle.

13. The method of claim 1, wherein performing the inspection indicates whether the reticle has been adversely affected by repeated exposure to radiation.

14. The method of claim 13, wherein an indication that the reticle has been adversely affected by repeated exposure to radiation means that at least one of the SE's has undergone healing.

* * * * *